(12) United States Patent
Smith et al.

(10) Patent No.: US 9,064,785 B2
(45) Date of Patent: Jun. 23, 2015

(54) ELECTRONIC DEVICE INCLUDING A CAPACITOR AND A PROCESS OF FORMING THE SAME

(75) Inventors: Bradley P. Smith, Austin, TX (US); Edward O. Travis, Austin, TX (US)

(73) Assignee: Freesacle Semiconductor, Inc., Austin, TX (US)

( * ) Notice: Subject to any disclaimer, the term of this patent is extended or adjusted under 35 U.S.C. 154(b) by 1250 days.

(21) Appl. No.: 11/780,900

(22) Filed: Jul. 20, 2007

(65) Prior Publication Data

US 2009/0020849 A1   Jan. 22, 2009

(51) Int. Cl.
   *G02F 1/1333*   (2006.01)
   *G02F 1/1343*   (2006.01)
   *H01L 21/66*    (2006.01)
   *H01L 49/02*    (2006.01)

(52) U.S. Cl.
   CPC ............. *H01L 22/20* (2013.01); *H01L 22/12* (2013.01); *H01L 28/40* (2013.01)

(58) Field of Classification Search
   USPC ............. 349/349, 42, 158, 38; 438/149, 151; 257/292, 225, 226
   See application file for complete search history.

(56) References Cited

U.S. PATENT DOCUMENTS

| | | | | |
|---|---|---|---|---|
| 5,157,001 | A * | 10/1992 | Sakuma | 438/465 |
| 6,358,792 | B1 * | 3/2002 | Hsue et al. | 438/250 |
| 6,534,340 | B1 * | 3/2003 | Karpman et al. | 438/113 |
| 6,562,656 | B1 * | 5/2003 | Ho | 438/107 |
| 6,765,265 | B2 * | 7/2004 | Yudasaka et al. | 257/347 |
| 6,887,730 | B2 * | 5/2005 | Wu et al. | 438/30 |
| 6,992,747 | B2 * | 1/2006 | Chen | 349/192 |
| 7,436,466 | B2 * | 10/2008 | Lai | 349/54 |
| 7,592,626 | B2 * | 9/2009 | Ozaki et al. | 257/68 |
| 2006/0226430 | A1 * | 10/2006 | Yamazaki | 257/72 |
| 2006/0231838 | A1 * | 10/2006 | Kim | 257/59 |
| 2008/0170167 | A1 * | 7/2008 | Su | 349/38 |

\* cited by examiner

*Primary Examiner* — Bradley K Smith
*Assistant Examiner* — David Goodwin

(57) ABSTRACT

An electronic device can include electronic components and an insulating layer overlying the electronic components. The electronic device can also include a capacitor overlying the insulating layer, wherein the capacitor includes a first electrode and a second electrode. The second electrode can include an opening, wherein from a top view, a defect lies within the opening. In another aspect, a process of forming an electronic device can include forming a first capacitor electrode layer over a substrate, forming a dielectric layer over the first capacitor electrode layer, and forming a second capacitor electrode layer over the dielectric layer. The process can also include detecting a defect and removing a first portion of the second capacitor electrode layer corresponding to the defect, wherein a second portion of the second capacitor electrode layer remains over the dielectric layer.

20 Claims, 5 Drawing Sheets

ELECTRONIC DEVICE INCLUDING A CAPACITOR AND A PROCESS OF FORMING THE SAME

BACKGROUND

1. Field of the Disclosure

The present disclosure relates to electronic devices and processes, and more particularly to electronic devices including capacitors and processes of forming the same.

2. Description of the Related Art

Electronic devices can include numerous components, many of which may switch on or off within a very short time period. When this occurs, power supply voltages, such as VDD, VSS, other suitable power supply voltage, or any combination there may fluctuate due to relatively large switching loads coupled to those voltage(s). In order to reduce this affect, decoupling capacitors can be added to the design to reduce the voltage swings as loads change. A decoupling capacitor occupies a large amount of area, and a relatively small defect can create an electrical short or leakage path that can render the decoupling capacitor non-functional. Reducing particles within a fabrication facility can reduce the likelihood of generating a defect; however, even the cleanest of clean rooms have particles. Therefore, totally preventing defects is practically impossible.

BRIEF DESCRIPTION OF THE DRAWINGS

Embodiments are illustrated by way of example and are not limited in the accompanying figures.

Figure 1:
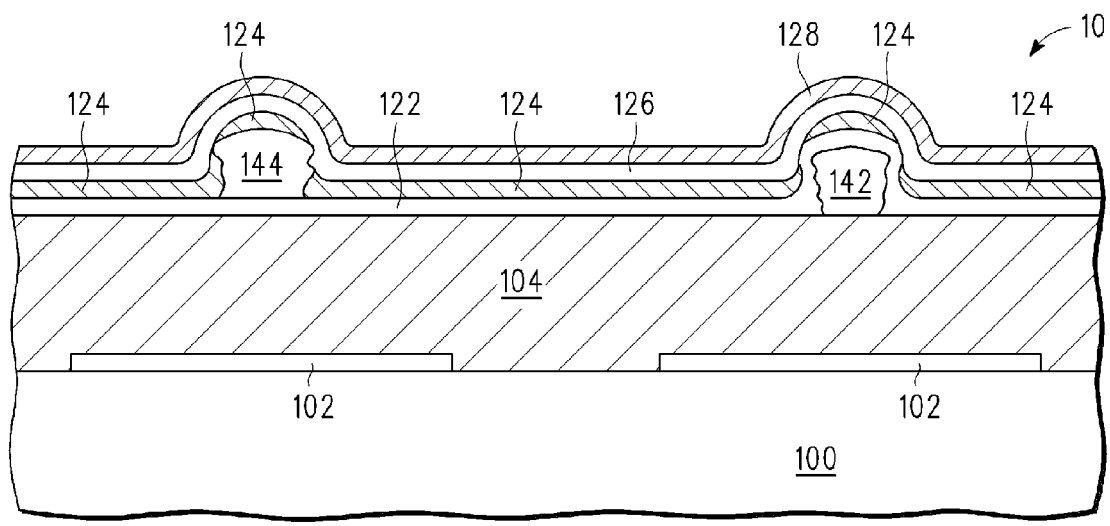
FIG. 1 includes an illustration of a cross-sectional view of a portion of a workpiece after forming layers for capacitors.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can be formed that includes a capacitor, wherein from a top view, a defect lies within the boundary of the capacitor. One or both electrodes of the capacitor can be formed, such that the defect does not render the capacitor non-functional. Thus, electronic devices can be formed with a higher yield.

In one aspect, an electronic device can include electronic components, an insulating layer overlying the electronic components, and a capacitor overlying the insulating layer, wherein the capacitor includes a first electrode and a second electrode. The second electrode can include an opening, and from a top view, a defect lies within the opening. In another aspect, a process of forming a workpiece can include forming a first capacitor electrode layer over a substrate, forming a dielectric layer over the first capacitor electrode layer, and forming a second capacitor electrode layer over the dielectric layer. The process can also include detecting a defect, and removing a first portion of the second capacitor electrode layer corresponding to the defect, wherein a second portion of the second capacitor electrode layer remains over the dielectric layer.

Before addressing details of embodiments described below, some terms are defined or clarified. The term "elevation" is intended to mean a shortest distance to a reference plane. In one embodiment, the reference plane is a primary surface of a substrate before forming any features overlying the substrate. Unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B is true (or present).

Unless otherwise defined, all technical and scientific terms used herein have the same meaning as commonly understood by one of ordinary skill in the art to which this invention belongs. Other features and advantages of the invention will be apparent from the following detailed description, and from the claims. To the extent not described herein, many details regarding specific materials, processing acts, and circuits are conventional and may be found in textbooks and other sources within the semiconductor and microelectronic arts.

The figures described in this specification include cross-sectional views and top views. After reading the entire specification, skilled artisan will appreciate that the scale for the top views are different from the cross-sectional views, and within each cross-sectional view, the elements and other features are exaggerated to simplify understanding of the concepts described herein.

FIG. 1 includes a cross-sectional view of a portion of a workpiece that includes a plurality of integrated circuits. In one embodiment, the integrated circuits are designed to be substantially identical to one another, and in another embodiment, the different integrated circuits may be designed to be different. As illustrated in FIG. 1, two integrated circuits are illustrated and have substantially identical designs. The workpiece 10 includes a substrate 100 that can include a monocrystalline semiconductor wafer, a semiconductor-on-insulator wafer, a flat panel display (e.g., a silicon layer over a glass plate), or other substrate conventionally used to form electronic devices.

Each integrated circuit within workpiece 10 has a set of components 102 that lie within the substrate 100, over the substrate 100, or any combination thereof. The components can include transistors, resistors, diodes, capacitors, other suitable components, or any combination thereof. In a particular embodiment, the sets of components 102 are substantially identical to one another. The sets of components 102 are formed by a conventional or proprietary process sequence.

An insulating layer 104 overlies the substrate 100 and sets of components 102. The insulating layer 104 can include an insulating material, such as an oxide, a nitride, an oxynitride, or a combination thereof. Although not illustrated, the insulating layer 104 can include a plurality of insulating films, and conductive plugs and interconnects may be formed therein to electrically couple or connect components within each set of components 104. In a particular embodiment, five or more interconnect levels may lie within the insulating layer 104. The insulating layer 104, including any the conductive plugs and interconnects therein (not illustrated), is formed by a conventional or proprietary deposition and etching or planarization sequence.

After forming the insulating layer 104, layers for capacitors are formed. Defects may be present after forming the insulating layer 104 and before forming the layers for the capacitors, defects can lie within a layer or between the layers for the capacitors, or any combination thereof. As illustrated in FIG. 1, a defect 142 overlies the surface of the insulating layer 104, and a defect 144 lies between layers for the capacitors. The significance of the defects 142 and 144 will be described after describing the layers for the capacitors.

The layers for the capacitors include a lower capacitor electrode layer 122, capacitor dielectric layer 124, and an upper capacitor electrode layer 126. A protective layer 128 is formed over the upper capacitor electrode layer 126, as illustrated in FIG. 1, and is optional. Each of the lower capacitor electrode layer 122 and the upper capacitor layer 126 can include doped silicon, tungsten, titanium, tantalum, titanium nitride, tantalum nitride, aluminum, copper, another suitable conductive material, or any combination thereof. Each of the lower capacitor electrode layer 122 and the upper capacitor layer 126 can have a thickness in a range of approximately 0.02 to approximately 0.5 microns. The lower capacitor electrode layer 122 and the upper capacitor layer 126 have the same composition or different compositions, and the same thickness or different thicknesses.

The capacitor dielectric layer 124 can include one or more films of silicon dioxide, silicon nitride, silicon oxynitride, a high dielectric constant ("high-k") material (e.g., dielectric constant greater than 8), or any combination thereof. The high-k material can include $Al_2O_3$, $Al_aO_bN_c$, $Hf_aO_bN_c$, $Hf_a\text{-}Si_bO_c$, $Hf_aSi_bO_cN_d$, $Hf_aZr_bO_cN_d$, $Hf_aZr_bSi_cO_dN_e$, $Hf_aZr_bO_c$, TaO, $Ta_aO_bN_c$, $TiO_2$, $Ti_aO_bN_c$, $Zr_aSi_bO_c$, $Zr_aSi_bO_cN_d$, $ZrO_2$, other Al-containing, Hf-containing, Ta-containing, Ti-containing or Zr-containing dielectric material, a doped version of any of the foregoing (lanthanum doped, niobium doped, etc.), or any combination thereof. In a particular embodiment, the capacitor dielectric layer 124 includes $Al_2O_3$. The capacitor dielectric layer 124 has a thickness in a range of approximately 3 to approximately 50 nm. The protective layer 128 can include one or more films of silicon dioxide, silicon nitride, silicon oxynitride, a carbon-containing material of the foregoing, or any combination thereof. The protective layer 128 has a thickness in a range of approximately 20 to approximately 200 nm. The layers 122, 124, 126, and 128 can be formed serially using conventional or proprietary deposition processes. In other embodiments, the layers 122, 124, 126, 128, or any combination thereof can have other dimensions or other materials.

Each of the defects 142 and 144 can result in an electrical short or leakage path between the capacitor electrode layers 122 and 126. The defect 142 is present before forming the lower capacitor electrode layer 122 (illustrated in FIG. 1) or is formed during formation of the lower capacitor electrode layer 122. The defect 144 is formed during formation of the lower capacitor electrode layer 122 (not illustrated) or is formed after forming the lower capacitor electrode layer 122 (illustrated in FIG. 1).

At this relatively late stage in processing the workpiece, there may be no commercially feasible ways to remove the defect 142, the defect 144, due to materials present, chemicals or methods used to remove the defect 142, or other processing complications. When the capacitor dielectric layer 124 is formed over the defects 142 and 144, the capacitor dielectric layer 124 is discontinuous along the surface of the workpiece (illustrated in FIG. 1) or is thin enough to affect the electronic performance of the capacitors being formed (e.g., tunneling charge, too low of a breakdown voltage, etc.). With respect to the defect 142, the lower capacitor electrode layer 122 and upper capacitor electrode layer 126 contact each other and are electrically shorted to one another. In addition, the dielectric 124 could be weakened and exhibit insufficient long-term reliability, leading to device failure at a later time. With respect to the defect 144, the defect 144 can be conductive or resistive and contact each of the lower electrode layer 122 and the upper capacitor electrode layer 126, and therefore, the defect 144 can electrically short or provide a leakage current path between the lower capacitor electrode layer 122 and the upper capacitor electrode layer 126.

Figure 2:
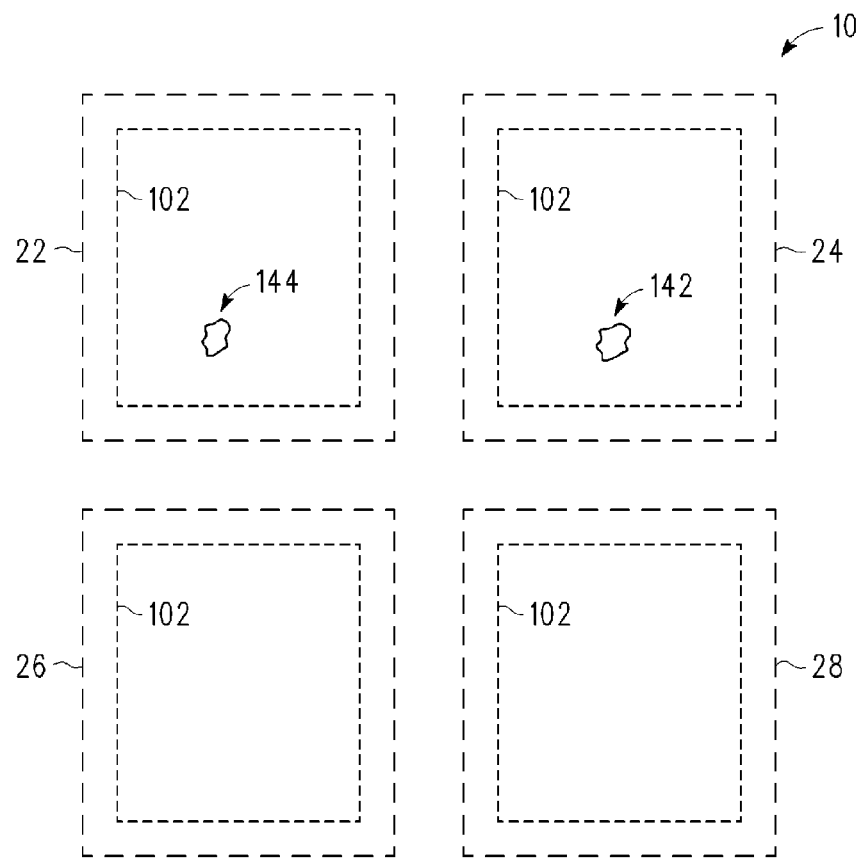
FIG. 2 includes an illustration of a top view of the workpiece of FIG. 1 illustrating four different integrated circuits and locations of defects.

FIG. 2 includes an illustration of a top view of the workpiece 10. As illustrated the workpiece includes partially fabricated integrated circuits 22, 24, 26, and 28. Scribe lanes, test structures, other suitable features, or any combination thereof can lie between the integrated circuits 22, 24, 26, and 28. The sets of components 102 are substantially identical in the integrated circuits 22, 24, 26, and 28. The sets of components 102 occupy most of the area of each integrated circuit. Bonding pads (not illustrated) can be subsequently formed between the sets of components 102 and edges of the integrated circuits. The integrated circuits 22, 24, 26, and 28 are designed to be substantially identical to one another; however, the unintended defects 142 and 144 may result in additional processing that changes the physical layout of the integrated circuits 22 and 24 to become different than the original design, as described in more detail below. In this particular embodiment, the integrated circuits 26 and 28 do not include any defects within the layers for the capacitors.

In the particular embodiment as illustrated in FIG. 2, the integrated circuit 22 includes the defect 144, and the integrated circuit 24 includes the defect 142. The workpiece 10 can be placed into an apparatus in which the defects can be detected and located. In a particular embodiment, the apparatus can include a radiation beam (e.g., a laser) and one or more detectors. The radiation beam can be directed to the exposed surface of the workpiece 10 and depending on the configuration of the detector(s), the presence or absence of a signal can be used to detect and locate the defects 142 and 144. The apparatus can be a conventional particle counter or similar in operation to the conventional particle counter. Alternatively, a dark field inspection may be performed to detect and locate the defects 142 and 144. In another embodiment, the same or different apparatus can be used to determine the size of each defect as would be seen from a top view of the workpiece 10. The sizing of the defects 142 and 144 is optional. The detection, location, or sizing of the defects 142 and 144 can be performed before or after forming any or all of the layers for the capacitors. The information regarding the defects 142 and 144 will be used in removing portions of the upper capacitor electrode layer 126 corresponding to the defects 142 and 144, as will be described in more detail below.

FIGS. 3 to 8 include illustrations during the patterning process in order to form the capacitors from the layers for the capacitors. The operations can include upper capacitor electrode definition, lower capacitor electrode definition, and removal of portions of the upper capacitor electrode layer 126 corresponding to the defects 142 and 144. The order of the operations can be in any order, and portions of different operations can be combined if needed or desired. Therefore, after reading the specification, skilled artisans will appreciate that the embodiments described with respect to capacitor forming as described in FIGS. 3 to 8 are merely illustrative.

Figure 3:
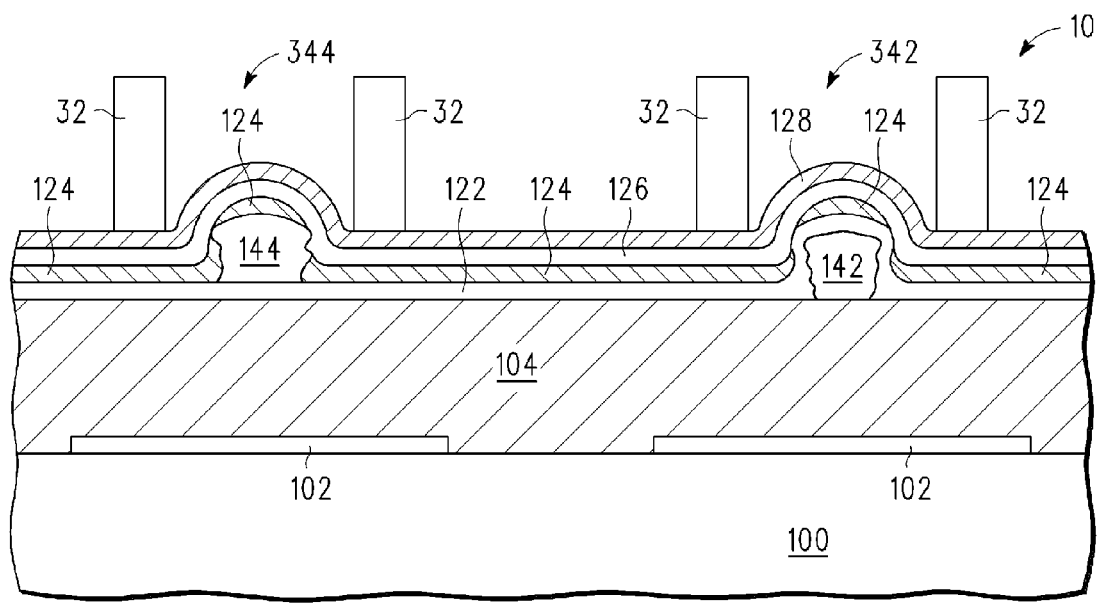
FIG. 3 includes an illustration of a cross-sectional view of the workpiece of FIG. 2 after forming a masking layer over the layers for capacitors.

Referring to FIG. 3, a masking layer is formed over the protective layer 128 and includes masking members 32 and openings 342 and 344 corresponding to the locations of the defects 142 and 144, respectively. The masking layer can include a resist film, a hard mask film, or a combination thereof. In a particular embodiment, the resist film can be formed over the workpiece 10 and selectively exposed for a first time to define the outer edges of the upper capacitor electrodes. The defects 142 and 144 would still be covered by the resist film at this point in the process.

The information collected with respect to the defects 142 and 144, and particularly, the location of the defects 142 and 144 can be used to selectively expose the resist film at locations corresponding to the defects 142 and 144. In one embodiment, a mask having a grid of metal lines on a quartz plate can be placed into a lithography tool. The blades of the lithography tool are positioned using the information regarding the defects 142 and 144. In other words, the blades are adjusted (e.g., closed down) to allow radiation to reach only those portions of the masking layer corresponding to the defects 142 and 144.

Alternatively, an energized beam, such as an electron beam, a laser, or an ion beam may be used in place of or in addition to the mask/blades lithography embodiment. The information collected with respect to the defects 142 and 144 is used to determine where the energized beam will be directed. Because the number of defects and size occupied are expected to be relatively small compared to the entire area of the workpiece, a writing tool (e.g., an e-beam writer, a laser writer, etc.) can be used without significantly adversely affecting throughput.

After the resist film has been exposed, a developer is used to remove exposed portions of the resist film and leave masking members 32 including openings 342 and 344. The resist film deposition, selective exposing, and developing are performed using convention or proprietary materials, apparatuses, and techniques. If a hard mask film is used, the hard mask film would be etched after the resist film is patterned as previously described.

Figure 4:
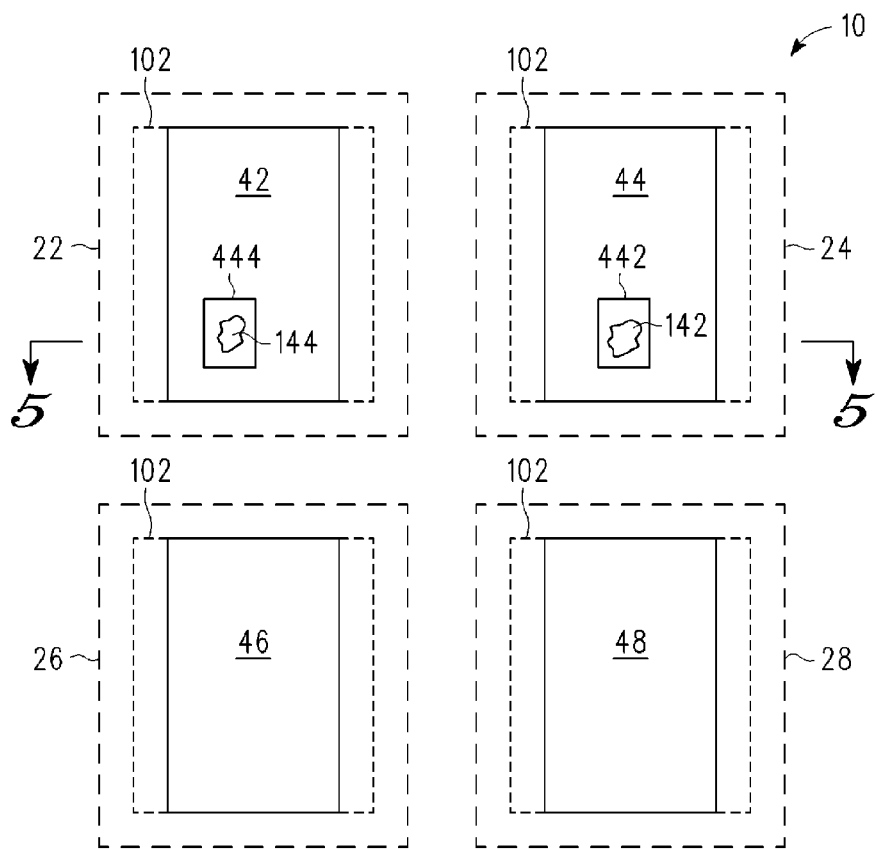
FIGS. 4 and 5 include an illustration of a top view and a cross-sectional view, respectively, of the workpiece of FIG. 3 after etching an upper electrode layer.
Figure 5:
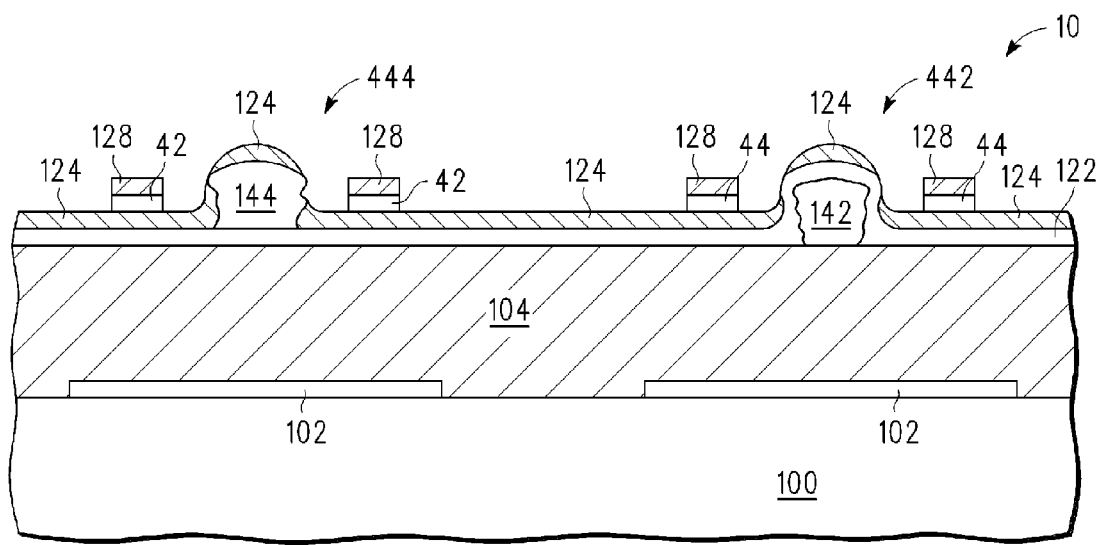

The protective layer 128 and the upper capacitor electrode layer 126 are etched to form the upper capacitor electrodes 42, 44, 46, and 48 as illustrated in FIGS. 4 and 5. The upper capacitor electrodes 42 and 44 include openings 442 and 444, respectively, wherein the defects 142 and 144 lie within the openings 442 and 444, respectively. By removing the upper capacitor electrode layer 126 from locations where the defects 142 and 144 reside, the likelihood of forming an electrical short or leakage path between the capacitor electrodes near the defects 142 and 144 is reduced and may even be substantially eliminated. Upper capacitor electrodes 46 and 48 for integrated circuits 26 and 28, respectively, are substantially identical. The upper capacitor electrodes 46 and 48 do not include any openings similar to opening 442 or 444 because the layers for the capacitors do not include any defects.

The etching of the protective layer 128 and the upper capacitor electrode layer 126 is performed using a conventional or proprietary etching sequence. The resist members 32 are removed using a conventional or proprietary ashing or wet strip technique. After reading the specification, skilled artisans will be able to determine particular etching chemistries and other etching parameters in view of the particular materials selected for the protective layer 128 and the upper capacitor electrode layer 126. At this point in the process for this particular embodiment, the upper capacitor electrode layer 126 has been patterned to define the upper capacitor electrodes 42, 44, 46, and 48 and openings 442 and 444 corresponding to locations of the defects 142 and 144.

Figure 6:
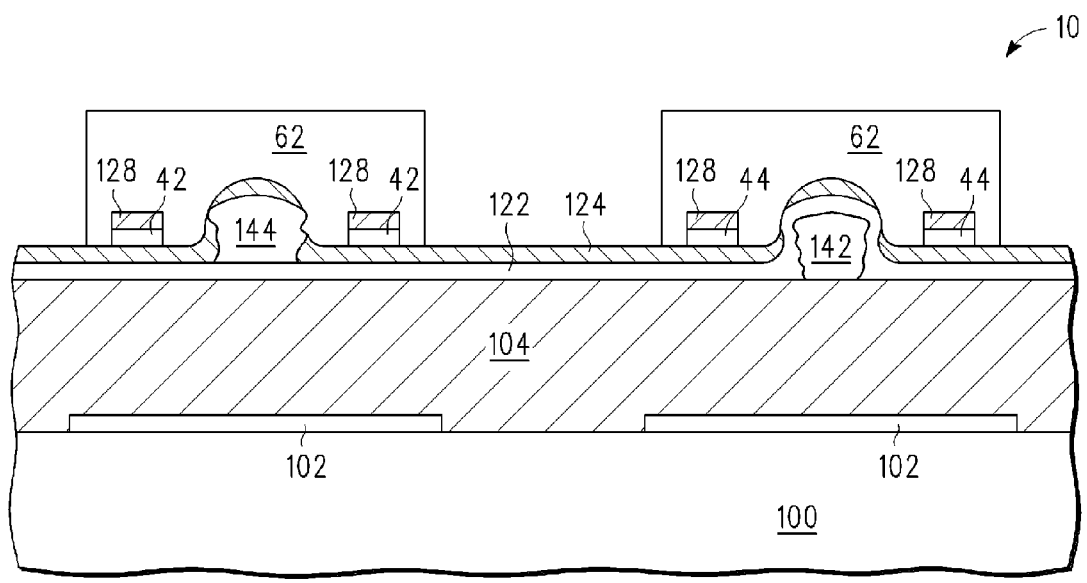
FIG. 6 includes an illustration of a cross-sectional view of the workpiece of FIGS. 4 and 5 after forming a masking layer over the lower electrode layer.

Referring to FIG. 6, another masking layer is formed over remaining portions of the protective layer 128 and exposed portions of the capacitor dielectric layer 124. The masking layer includes masking members 62. This other masking layer can include a resist film, a hard mask film, or a combination thereof. In a particular embodiment, the resist film can be formed over the workpiece 10 and selectively exposed to define the outer edges of the lower capacitor electrodes. The defects 142 and 144 are covered by the resist film. After the resist film has been exposed, a developer is used to remove exposed portions of the resist film and leave masking members 62. Although not illustrated, a process sequence as previously described with respect to patterning the resist layer for openings 342 and 344 corresponding to the defects 142 and 144 can be performed if desired.

Figure 7:
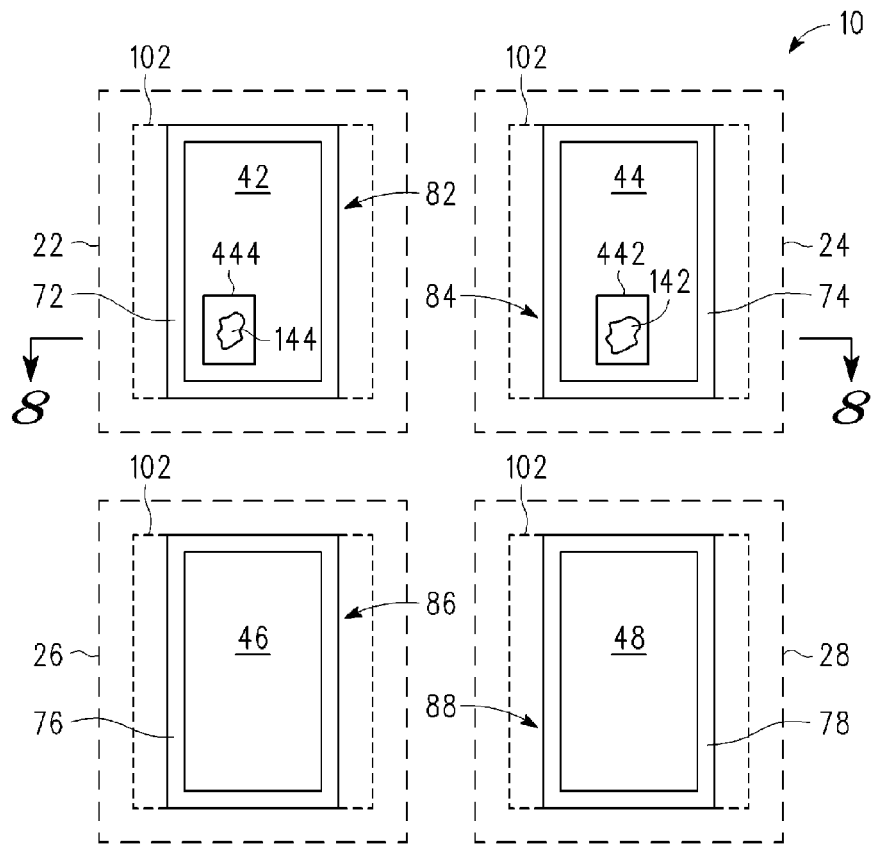
FIGS. 7 and 8 include an illustration of a top view and a cross-sectional view, respectively, of the workpiece of FIG. 6 after etching a lower electrode layer.
Figure 8:
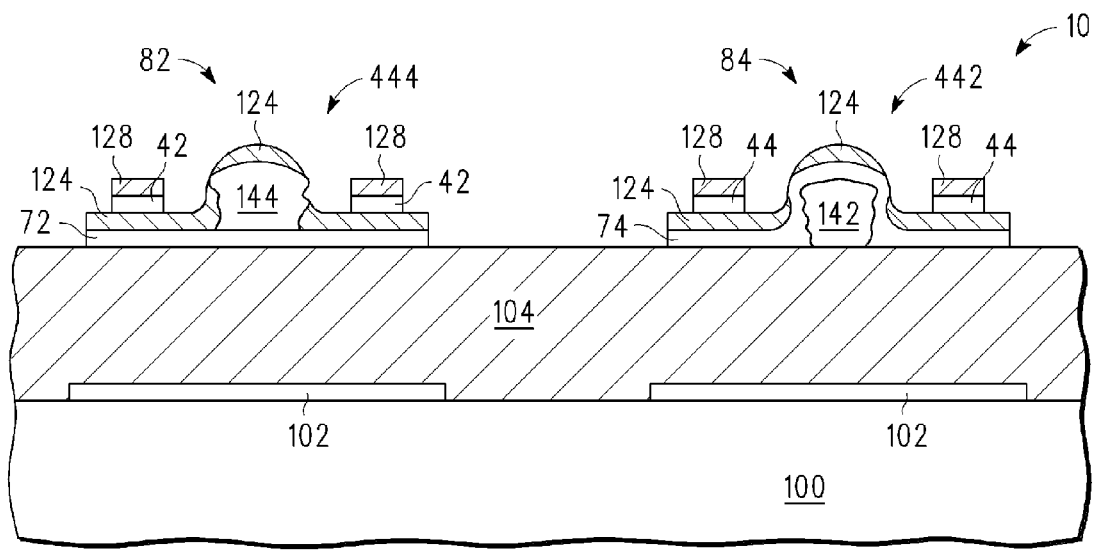

The capacitor dielectric layer 124 and the lower capacitor electrode layer 122 are etched to form the lower capacitor electrodes 72, 74, 76, and 78 as illustrated in FIGS. 7 and 8. In this particular embodiment, lower capacitor electrodes 72, 74, 76 and 78 for integrated circuits 22, 24, 26 and 28, respectively, are substantially identical. The lower capacitor electrodes 72, 74, 76 and 78 extend beyond one or more edges of the corresponding upper capacitor electrodes 42, 44, 46, and 48 to allow top side electrical contacts to be made to the lower electrodes 72, 74, 76, and 78.

The etching of the capacitor dielectric layer 124 and the lower capacitor electrode layer 122 is performed using a conventional or proprietary etching sequence. The resist members 62 are removed using a conventional or proprietary ashing or wet strip technique. After reading the specification, skilled artisans will be able to determine particular etching chemistries and other etching parameters in view the particular materials selected for the capacitor dielectric layer 124 and the lower capacitor electrode layer 122. At this point in the process, the capacitors 81, 83, 85, and 87 have been formed and include the upper capacitor electrodes 42, 44, 46, and 48 and the lower capacitor electrodes 72, 74, 76, and 78. Within each integrated circuit, the capacitor overlies most of the integrated circuit and the set of components 102 therein, even when opening(s) in one or both capacitor electrodes are taken into account. In other words, the net area of the capacitor (area of the workpiece covered by both the upper and lower capacitor electrodes, not the area covered by only one of the capacitor electrodes) is greater than half of the area of the workpiece occupied by each of the integrated circuit and the underlying set of components 102.

In other embodiments, other shapes can be used. The capacitor electrodes can be designed with a different shape (i.e., other than rectilinear with one capacitor electrode overlying the other capacitor electrode). For example, any capacitor electrode or combination of capacitor electrodes can have a serpentine shape, an interdigitated finger shape, another suitable capacitor electrode shape, or any combination thereof can be used. The capacitor electrodes do not need to overlie one another, and thus, the capacitor electrodes may lie side-by-side. A portion of either capacitor electrode, or portions of the capacitors electrodes corresponding to the defect can be removed. The embodiments described herein can be used to remove a portion of a capacitor electrode to substantially keep a defect from forming an electrical short or leakage path between the capacitor electrodes within the same capacitor.

Figure 9:
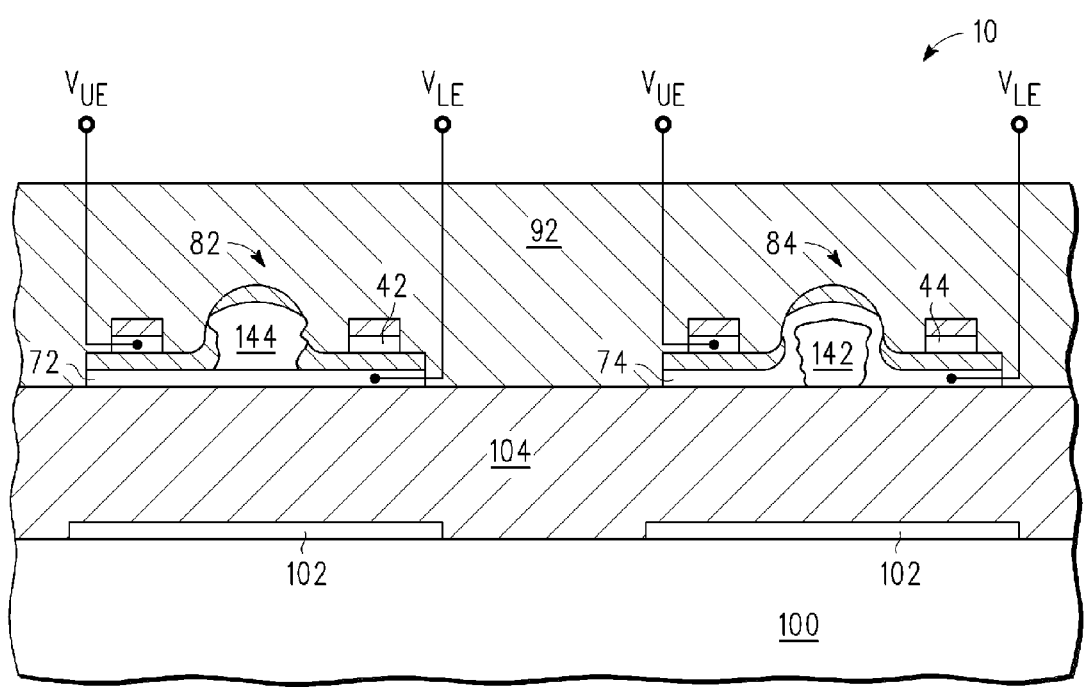
FIG. 9 includes an illustration of a cross-sectional view of the workpiece of FIG. 8 after forming substantially completed integrated circuits.

FIG. 9 includes an illustration of a cross-sectional view of substantially completed electronic devices for the workpiece 10. One or more additional insulating and interconnect levels can be formed, but are not illustrated in FIG. 9. As illustrated in FIG. 9, a passivating layer 92 is formed over the capacitors. The passivating layer 92 can include one or more insulating film(s), such as an oxide, a nitride, an oxynitride, or a combination thereof. Although not illustrated, openings for bonding pads for the integrated circuits can be formed. The bonding pads can include power supply (e.g., $V_{DD}$, $V_{SS}$, $V_{PP}$, etc.) and other signal terminals for the integrated circuit. Additional processing can be performed to separate the workpiece into die corresponding to the integrated circuit, and to assemble the die into a package. The processing to form the substantially completed electronic devices is conventional or proprietary.

The upper capacitor electrodes are coupled to an upper capacitor electrode voltage ($V_{UE}$) terminal, and the lower capacitor electrodes are coupled to a lower capacitor electrode voltage ($V_{LE}$) terminal. The $V_{UE}$ terminal can be coupled to a power supply terminal or another signal terminal, to a component within the set of components 102, the substrate 100, or any combination thereof. The $V_{LE}$ terminal can be coupled to a power supply terminal or another signal terminal, to a component within the set of components 102, the substrate 100, or any combination thereof. The $V_{UE}$ and $V_{LE}$ terminals are connected to different parts of the integrated circuit.

The processes described herein are flexible with respect to when portions of the second electrode layer 126 corresponding to the defects 142 and 144 are removed. As previously described, the portions can be removed when patterning the second electrode layer 126. In other embodiments, the portions can be removed when patterning the first electrode layer 122 or separately from patterning the first electrode layer 122 and the second electrode layer 126.

Embodiments described herein are useful in forming large capacitors occupying a substantial portion of an integrated circuit where the actual capacitance of the large capacitors is not critical. Moreover, the process described herein can be useful in forming other sizes of capacitors as well. In particular embodiments, the capacitors 82, 84, 86, and 88 can be used as decoupling capacitors to reduce noise or other relatively high frequency voltage changes on a power supply line due to components within the integrated circuit changing state (e.g., transistors turning on or off). Thus, the capacitors do not need to be substantially identical in capacitance from integrated circuit to integrated circuit. After reading this specification, a user can determine when the capacitance becomes unacceptably low due to too many defects or a single device being too large. In one embodiment, if the actual capacitance or actual area occupied by either or both capacitor electrodes is less than 80% of the designed capacitance or designed area occupied by either or both capacitor electrodes (not taking into account the reduced area due to defects), the integrated circuit may be rejected. In other embodiment, the lower limit can be 90% or 95%, rather than 80%. Skilled artisans will be able to determine a level at which defects become too high in view of their needs or desires. Alternatively, an electrical test or internal circuitry may be capable of determining how much area was removed because of the defects. Adjustments may be made or information stored accordingly. For example, a fuse can be blown, information regarding effective capacitance or area affected can be stored in a non-volatile memory (e.g., a register), the electronic device can be sorted according to remaining area, or the like. Also, capacitive structures may be designed with other areas for potential defects. If no defects are found, a portion of capacitor electrodes of a non-defective capacitor may be removed to adjust size (e.g., trimmed to allow the capacitors to be closer to a specified or more uniform capacitance, as compared to other capacitors that may or may not have a defect).

The embodiments also allow a potentially fatal defect to be rendered into a non-fatal state without having to expose the workpiece to additional chemicals or having to remove and redeposit the layers for the capacitors. Yield of the integrated circuits and equipment throughput for the deposition and cleaning equipment is improved. The processing sequence is highly flexible and can be adapted to a particular application with relative ease.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming a workpiece can include forming a first capacitor electrode layer over a substrate, forming a dielectric layer over the first capacitor electrode layer, and forming a second capacitor electrode layer over the dielectric layer. The process can also include detecting a defect and removing a first portion of the second capacitor electrode layer corresponding to the defect, wherein a second portion of the second capacitor electrode layer remains over the dielectric layer.

In one embodiment of the first aspect, a first amount of area is designed to be covered by the second capacitor electrode layer, and after removing the first portion of the second capacitor electrode layer, a second amount of area is actually covered by the second capacitor electrode layer, wherein the second area is less than the first area. In a particular embodiment, the process forms a first integrated circuit including a first capacitor and a second integrated circuit including a second capacitor. The first capacitor occupies the second amount of area, and the second capacitor occupies the first amount of area. In a more particular embodiment, other than the first capacitor and the second capacitor, the first integrated circuit and the second integrated circuit are substantially identical.

In another embodiment of the first aspect, the defect is present over the substrate before forming the first capacitor electrode layer. In still another embodiment, the defect is present over the substrate after forming the first capacitor electrode layer and before forming the second capacitor electrode layer.

In a further embodiment of the first aspect, the process further includes patterning the first capacitor electrode layer to form a first electrode of a capacitor, patterning the second capacitor electrode layer to form a second electrode of the capacitor, forming a power supply terminal that is electrically coupled to the capacitor electrode, and forming a passivating layer over the second capacitor electrode layer after removing the first portion of the second capacitor electrode layer and after forming the power supply terminal. In a particular embodiment, patterning the first capacitor electrode layer and patterning the second capacitor electrode layer are performed such that the capacitor covers most of the of the area of an integrated circuit including a transistor structure.

In still a further embodiment of the first aspect, the process further includes patterning the first capacitor electrode layer to form a first electrode of a capacitor and patterning the second capacitor electrode layer to form a second electrode of the capacitor, wherein removing the first portion of the second capacitor electrode layer is performed separately from each of patterning the first capacitor electrode layer and patterning the second capacitor electrode layer. In yet a further embodiment, the process further includes patterning the first capacitor electrode layer to form a first electrode of a capacitor and patterning the second capacitor electrode layer to form a second electrode of the capacitor, wherein removing the first portion of the second capacitor electrode layer is performed substantially simultaneously with patterning the first capacitor electrode layer or patterning the second capacitor electrode layer.

In a yet a further embodiment of the first aspect, the process further includes locating the defect, depositing a resist layer over the second capacitor electrode layer, and removing a first portion of the resist layer overlying the defect. The first portion corresponds to a location of the defect, and a second portion of the resist layer remains over the second capacitor electrode layer. In a more particular embodiment, the process further includes selectively exposing the first portion of the resist layer using a lithographic tool, a laser, or an energized beam, wherein selectively exposing is performed before removing the first portion.

In another more particular embodiment, the process further includes removing a third portion of the second capacitor electrode layer at substantially the same time as removing the first portion, wherein the second portion of the second capacitor electrode layer includes a second electrode of a capacitor.

In still another more particular embodiment of the first aspect, the process further includes removing a third portion of the second capacitor electrode layer at a different time as compared to removing the first portion of the second capacitor electrode layer, wherein removing the first portion and the third portion of the second capacitor electrode layer, the second portion of the second capacitor electrode layer includes a second electrode of a capacitor. In another embodiment, the process further includes forming a masking layer over the first capacitor electrode layer, and removing an exposed portion of the first capacitor electrode layer to form a first electrode of a capacitor.

In a second aspect, an electronic device can include electronic components, an insulating layer overlying the electronic components, and a capacitor overlying the insulating layer. The capacitor includes a first electrode and a second electrode, and the first electrode or the second electrode includes an opening, and from a top view, a defect lies within the opening.

In one embodiment of the second aspect, the capacitor occupies most of an area occupied by the electronic components and is electrically coupled to a power supply terminal. In a particular embodiment, the defect lies between the insulating layer and the capacitor. In another embodiment, the defect overlies the first electrode of the capacitor.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

Many other embodiments may be apparent to those of skill in the art upon reviewing the disclosure. Other embodiments may be used or derived from the disclosure, such that a structural substitution, logical substitution, or another change may be made without departing from the scope of the disclosure. Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description. It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming a workpiece comprising:
   forming a first capacitor electrode layer over a substrate including first and second sets of components;
   forming a dielectric layer over the first capacitor electrode layer;
   forming a second capacitor electrode layer over the dielectric layer;
   detecting a defect, the second capacitor electrode layer overlying the defect;
   patterning the second capacitor electrode layer to form a second electrode of a first capacitor structure and a second electrode of a second capacitor structure, the first capacitor structure associated with the first set of components and the second capacitor structure associated with the second set of components, wherein substantially none of the second electrode of the first or second capacitor structures directly overlies the defect; and
   after patterning the second capacitor electrode layer, patterning the dielectric layer and the first capacitor electrode layer to form a first electrode of the first capacitor structure and a first electrode of the second capacitor structure, wherein the defect overlies or directly contacts the first electrode of the first capacitor structure; and
   wherein, when a first integrated circuit is substantially completed:
     the first integrated circuit includes the first capacitor structure having a capacitance and includes the first set of components; and
     each of the first and second capacitor electrodes of the first capacitor structure is electrically connected to a power supply terminal, a component of the first set of components, or the substrate, the first and second capacitor electrodes are electrically connected to different parts of the integrated circuit.

2. The process of claim 1, wherein:
   the process forms a second integrated circuit including the second capacitor structure including the first capacitor electrode and the second capacitor electrode overlying the first capacitor electrode;

the second capacitor electrode of the first capacitor structure occupies a first amount of area; and the second capacitor electrode of the second capacitor structure occupies a second amount of area that is greater than the first amount of area.

3. The process of claim 2, wherein other than the first capacitor structure and the second capacitor structure, the process is performed such that the first integrated circuit and the second integrated circuit are substantially identical.

4. The process of claim 1, wherein forming the first capacitor electrode layer comprises forming the first capacitor electrode layer over and in direct contact with the defect.

5. The process of claim 1, wherein the defect is present over the first capacitor electrode layer before forming the second capacitor electrode layer.

6. The process of claim 1, further comprising:
separating the workpiece to obtain a die including the first capacitor structure; and
packaging the die to form the first integrated circuit.

7. The process of claim 1, wherein patterning the first capacitor electrode layer and patterning the second capacitor electrode layer are performed such that the first capacitor structure covers most of the area of the first integrated circuit and a transistor structure within the first integrated circuit.

8. The process of claim 1, further comprising:
locating the defect;
depositing a resist layer over the second capacitor electrode layer; and
removing a first portion of the resist layer overlying the defect, wherein the first portion corresponds to a location of the defect, and a second portion of the resist layer remains over the second capacitor electrode layer.

9. The process of claim 8, further comprising selectively exposing the first portion of the resist layer using a lithographic tool, wherein selectively exposing is performed before patterning the second capacitor electrode layer.

10. The process of claim 8, further comprising selectively exposing the first portion of the resist layer using a laser or an energized beam, wherein selectively exposing is performed before patterning the second capacitor electrode layer.

11. The process of claim 8, wherein patterning the second capacitor electrode layer comprises removing a portion of the second capacitor electrode layer corresponding to the first portion of the resist layer.

12. The process of claim 1, wherein patterning the first capacitor electrode layer comprises:
forming a masking layer over the first capacitor electrode layer after patterning the second capacitor electrode layer; and
removing an exposed portion of the first capacitor electrode layer to form the first electrodes of the first capacitor structure and the second capacitor structure after patterning the second capacitor electrode layer.

13. The process of claim 2, wherein before forming the first capacitor electrode layer, the first and second integrated circuits are substantially identical to each other.

14. The process of claim 1, wherein the first and second capacitor structures have substantially a same capacitance.

15. The process of claim 1, wherein the first and second capacitor structures have different capacitances.

16. The process of claim 2 wherein, before forming the first capacitor electrode layer, the first and second integrated circuits are different from each other.

17. The process of claim 1, wherein, the first capacitor electrodes of the first and second capacitor structures occupy substantially a same area.

18. A process of forming a workpiece comprising:
forming a first capacitor electrode layer over a substrate including first and second sets of components;
forming a dielectric layer over the first capacitor electrode layer;
forming a second capacitor electrode layer over the dielectric layer;
detecting a defect;
after detecting, patterning the second capacitor electrode layer to form a second electrode of a first capacitor structure and a second electrode of a second capacitor structure, the first capacitor structure associated with the first set of components and the second capacitor structure associated with the second set of components, wherein substantially none of the second electrode of the first or second capacitor structure directly overlies the defect; and
after patterning the second capacitor electrode layer, patterning the dielectric layer and the first capacitor electrode layer to form a first electrode of the first capacitor structure and a first electrode of the second capacitor structure, wherein the defect overlies or directly contacts the first electrode of the first capacitor structure.

19. The process of claim 18, wherein:
the second capacitor electrode of the first capacitor structure occupies a first amount of area; and
the second capacitor electrode of the second capacitor structure occupies a second amount of area that is greater than the first amount of area.

20. The process of claim 18, wherein, the first capacitor electrodes of the first and second capacitor structures occupy substantially a same amount of area.

* * * * *